United States Patent [19]

Alzati et al.

[11] Patent Number: 4,553,046
[45] Date of Patent: Nov. 12, 1985

[54] MONOLITHICALLY INTEGRATABLE BISTABLE MULTIVIBRATOR CIRCUIT HAVING AT LEAST ONE OUTPUT THAT CAN BE PLACED IN A PREFERENTIAL STATE

[75] Inventors: Angelo Alzati, Bollate; Claudio Diazzi, Milan; Fabrizio Stefani, Cardano al Campo, all of Italy

[73] Assignee: SGS-ATES Componenti Elettronici SpA, Milan, Italy

[21] Appl. No.: 498,595

[22] Filed: May 26, 1983

[30] Foreign Application Priority Data

May 26, 1982 [IT] Italy ................ 21486 A/82

[51] Int. Cl.[4] ............ H03K 3/286; H03K 3/353; H03K 3/287
[52] U.S. Cl. .................... 307/289; 307/291; 307/555; 307/247 R; 307/272 R
[58] Field of Search ............ 307/291, 292, 289, 473, 307/264, 608, 247 R, 272 R, 552, 555

[56] References Cited

U.S. PATENT DOCUMENTS

| 3,753,009 | 8/1973 | Clapper ............... 307/291 |
| 4,114,052 | 9/1978 | Manabe et al. ........ 307/289 |
| 4,179,628 | 12/1979 | Ohgishi et al. ....... 307/291 |
| 4,306,162 | 12/1981 | Hart ................... 307/291 |

FOREIGN PATENT DOCUMENTS

| 0013686 | 7/1979 | European Pat. Off. . |
| 872433 | 7/1961 | United Kingdom . |
| 1113306 | 5/1968 | United Kingdom . |
| 1253379 | 11/1971 | United Kingdom . |
| 1584724 | 2/1981 | United Kingdom . |

OTHER PUBLICATIONS

Millman & Taub, "Pulse, Digital and Switching Waveforms", McGraw Hill & Co. publishers, p. 383, FIGS. 10-14A.

Primary Examiner—Stanley D. Miller
Assistant Examiner—Timothy P. Callahan
Attorney, Agent, or Firm—Wenderoth, Lind & Ponack

[57] ABSTRACT

A bistable multivibrator circuit includes two main transistors and two other transistors and an additional pair of transistors. The multivibrator circuit can be monolithically integrated and has an output that can be placed in a preferential state. The two other transistors are utilized to set and reset the multivibrator circuit while the two additional transistors form a control circuit for controlling the multivibrator circuit so as to cause its outputs to be in a prescribed preferential state.

4 Claims, 2 Drawing Figures

MONOLITHICALLY INTEGRATABLE BISTABLE MULTIVIBRATOR CIRCUIT HAVING AT LEAST ONE OUTPUT THAT CAN BE PLACED IN A PREFERENTIAL STATE

BACKGROUND OF THE INVENTION

The present invention relates to a bistable multivibrator circuit which can be monolithically integrated and has an output that can be placed in a preferential state. The circuit is applicable, for example, to control circuits for high-speed printers and in advanced electronic fuel injection systems for automobile engines.

Bistable multivibrators are known to have particular sequential logic networks characterized by two possible internal stable states (conventionally indicated by the symbols "0" and "1") with which are associated two different states of output or outputs represented by output variables that can be in either of the two states 0 and 1.

The internal state and the state of the outputs of a bistable multivibrator vary in accordance with the input or inputs with which are associated input variables which represent the state thereof and which can only assume the values 1 and 0.

The various types of bistable multivibrators can differ from one another in the number of inputs and in the mode in which the state of the bistable is determined by the configuration of the input states, or by the particular logic function characterizing the bistable.

Thus, the circuitry for each type of bistable can be produced by use of different technologies and base components, while maintaining its own particular logic function.

An electric component particularly adapted for use in logic circuits is the transistor. A transistor, suitably biased, can in fact be driven alternately from a high-voltage, low-current state to a low-voltage, high-current state.

In the first state, between the emitter and the collector terminals, a transistor is practically an open circuit ("off" state or "0" state); in the second state, the transistor is a short circuit ("on" state or "1" state). Thus, the collector-emitter voltage can be adopted as an output variable, associating therewith the values 0 and 1 corresponding to the two different states of the transistor mentioned above, in accordance with a "positive" logic.

The operating mode of the transistor which is the closest to the operation of an ideal switch (with an "off" state and an "on" state) is that in which the transistor, when closed, operates at saturation and is cut off when open. The transistor can be driven to the two different states of saturation and cut-off by appropriately varying the base-emitter voltage; the base-emitter voltage can thus be adopted as an input variable.

The base-emitter levels determining the saturation conditions are higher than those determining the cut off conditions and are quite different therefrom. Thus, one can also associate—with the same "positive" logic adopted for the output variables—the values 1 and 0 with the input variable (base-emitter voltage), respectively, in the case of saturation (a high base-emitter voltage) and in the case of cut-off (a low base-emitter voltage).

The type of bistable that can be produced in the easiest and most economical way from the circuitry point of view is the "S-R" type, having two inputs indicated by the letters S (SET) and R (RESET) and an output whose state corresponds directly to the internal state.

If both input variables of an S-R bistable assume the value 0, the internal state remains unchanged.

If the input S assumes the value 0 and the input R assumes the value 1, the bistable is placed in the "0" state, which corresponds to the value "0" at the output independently of the previous state, and if the input S assumes the value 1 and the input R assumes the value 0, the bistable is placed in the "1" state, which corresponds to the value 1 at the output, independently of the previous state.

The condition where the inputs simultaneously have the value "1" does not determine the state of the bistable.

It is well known that a bistable S-R multivibrator can be realized circuitwise with two main transistors, each having its collector connected through suitable resistors to the base of the other transistor, and to a first pole of a DC supply voltage and having two other auxiliary transistors whose collectors are respectively connected to the bases of the two main transistors and whose emitters are connected to a second pole of the DC supply voltage.

In current technical applications such as, for example, in circuits for controlling high-speed printers or in electronic fuel injection systems for automobile engines, bistable multivibrator circuits are required which can be integrated monolithically and mass-produced economically, such as those of the S-R type, but with an output which can also be placed in a preferential state, independently of the values assumed by the input variables which determine the state thereof under normal operating conditions.

SUMMARY OF THE INVENTION

The object of the present invention is to create a bistable multivibrator circuit which can be integrated monolithically and which has an output that can be placed in a preferential state independently of the values assumed by the input variables, which determine the state thereof under normal operating conditions, and which can be mass-produced economically.

This object can be achieved with the bistable multivibrator circuit defined and characterized in the claims contained herein.

BRIEF DESCRIPTION OF THE DRAWINGS

The invention will be better understood from the ensuing detailed description given solely by way of nonlimitative example with reference to the accompanying drawings, wherein.

Throughout the figures, like reference numerals refer to like parts.

DESCRIPTION OF THE PREFERRED EMBODIMENTS

Figure 1:
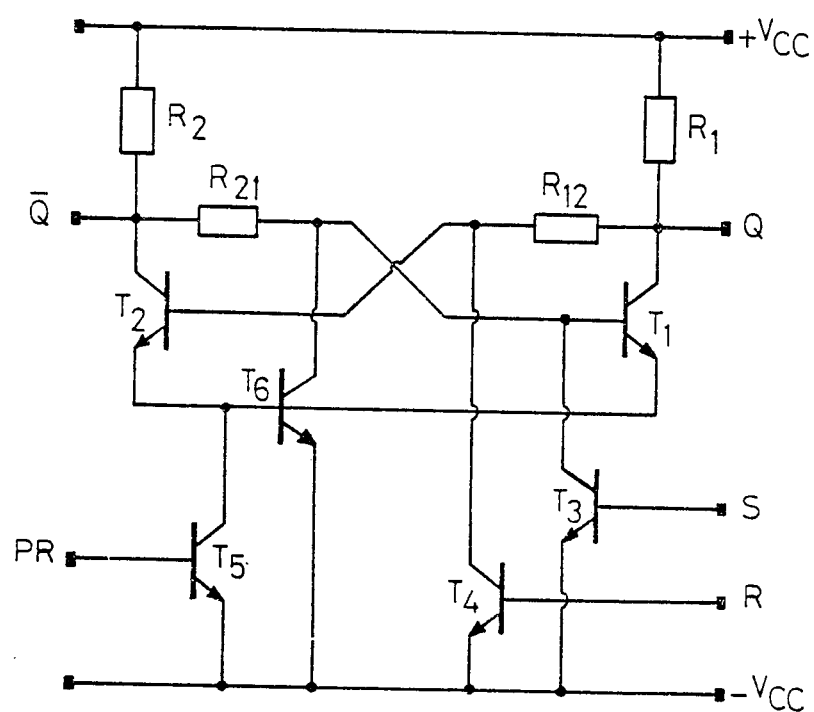
FIG. 1 is the circuit diagram of a bistable multivibrator having an output that can be placed in a preferential state in accordance with the present invention.

The circuit diagram shown in FIG. 1 comprises a first bipolar transistor $T_1$, a second bipolar transistor $T_2$, a third bipolar transistor $T_3$, and a fourth $T_4$ bipolar transistor, all of the NPN type. The collector of transistor $T_1$ is connected through resistor $R_1$ to the positive pole $+V_{cc}$ of a DC supply voltage and to the base of transistor $T_2$ through resistor $R_{12}$.

The collector of transistor $T_2$ is connected through resistor $R_2$ to $+V_{cc}$ and to the base of transistor $T_1$ through resistor $R_{21}$.

The collectors of transistors $T_3$ and $T_4$ are respectively connected to the bases of $T_1$ and $T_2$. The emitters of transistors $T_3$ and $T_4$ are connected to the negative pole $-V_{cc}$ of the DC supply voltage. The transistors $T_1$, $T_2$, $T_3$ and $T_4$ form a bistable S-R multivibrator whose input terminals respectively comprise the bases of transistors $T_3$ and $T_4$ and are respectively denoted as S ("SET") and R ("RESET"). The collectors of transistors $T_1$ and $T_2$ respectively form the output terminals, Q and $\overline{Q}$.

The circuit diagram in FIG. 1 also has a fifth bipolar NPN transistor $T_5$ and a sixth bipolar NPN transistor $T_6$. The emitters of transistors $T_1$ and $T_2$ and the base of transistor $T_6$ are connected to the collector of transistor $T_5$; the collector of transistor $T_6$ is connected to the base of transistor $T_1$ and the emitters of transistors $T_5$ and $T_6$ are connected to $-V_{cc}$. The base of $T_5$ forms a terminal PR for placing the bistable in a preferential state.

Figure 2:
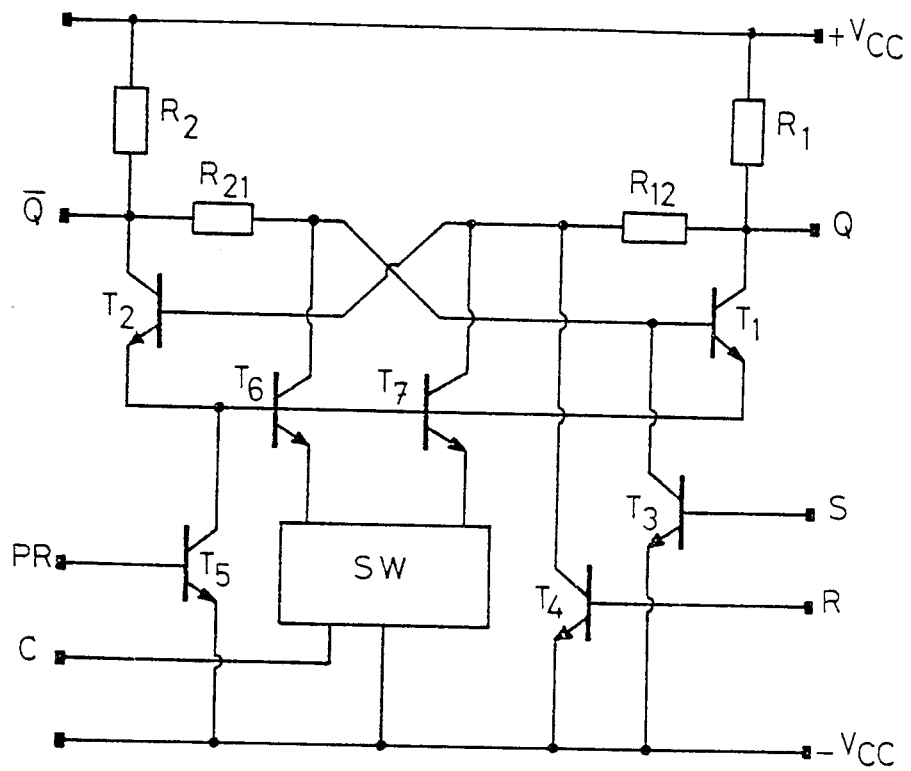
FIG. 2 is the circuit diagram of a different embodiment of the bistable multivibrator in accordance with the present invention.

The circuit diagram shown in FIG. 2 is similar to that of FIG. 1 but, unlike the latter, it also has a seventh bipolar NPN transistor $T_7$ whose collector and base are respectively connected to the base of transistor $T_2$ and to the collector of transistor $T_5$. Moreover, the emitter of transistor $T_6$ is not connected directly to $-V_{cc}$, but is coupled, together with the emitter of transistor $T_7$, to $-V_{cc}$ through a commercially available switching circuit means (e.g.—an SPDT analog gate) indicated in the figure by a rectangular block marked with the symbol SW and provided with a control terminal C to enable the alternate connection of a selected emitter to $-V_{cc}$.

Let us now examine in particular the operation of the bistable multivibrator circuit shown in FIG. 1, differentiating the two cases in which the potential of the terminal PR is such, with respect to the reference potential of $-V_{cc}$, as to determine the conduction to saturation or the cut-off of the transistor $T_5$.

In the first case, (in the case of a high base-emitter voltage), the transistor $T_5$ absorbs all the emitter current of transistors $T_1$ and $T_2$, so that transistor $T_6$ is cut off and does not in any way affect the normal operation of the bistable S-R multivibrator consisting of the structure comprising the transistors $T_1$, $T_2$, $T_3$ and $T_4$ and the resistors $R_1$, $R_2$, $R_{12}$ and $R_{21}$.

Now, if the base-emitter voltages of the transistors $T_3$ and $T_4$ are such as to produce non-conduction therein, or if both inputs S and R assume the value 0 (i.e.—S=0 and R=0), the biasing conditions of transistors $T_1$ and $T_2$ do not vary; hence, the multivibrator maintains its preexisting state and the potential of the outputs Q and $\overline{Q}$ remains unchanged.

If, instead, the input S assumes a value of 1 and the input R assumes a value of 0 (S=1, R=0), then transistor $T_3$ is at saturation and causes the cut-off of transistor $T_1$, whereas transistor $T_4$ is cut off and, therefore, transistor $T_2$ is at saturation. The voltage drops on the divider $R_1$-$R_{12}$ raise the potential of the output Q to the level 1, while the output $\overline{Q}$ is forced from the saturation of transistor $T_2$ to the low level 0 (i.e.—Q=1, $\overline{Q}$=0), independently of the previous state).

In the opposite case, (i.e.—S=0, R=1), transistor $T_3$ is cut off and transistor $T_1$ is at saturation, while transistor $T_4$, which is at saturation, causes the cut-off of transistor $T_2$. Since the collector-emitter voltages of the transistors $T_1$ and $T_4$ at saturation are small, the potential of the output terminal Q drops to the level 0, while the voltage drop on the divider $R_2$-$R_{21}$ raise the potential of $\overline{Q}$ to the level 1 (i.e.—Q=0, $\overline{Q}$=1), independently of the previous state.

If the inputs simultaneously have the value 1, transistors $T_3$ and $T_4$ are both saturated, and transistors $T_1$ and $T_2$ are both cut off. The potential of both outputs is that which is determined by the dividers $R_1$-$R_{12}$ and $R_2$-$R_{21}$, so that Q=1, $\overline{Q}$=1, independently of the previous state.

On the other hand, in the case where the potential level of the terminal PR is such as to prevent transistor $T_5$ from becoming conductive, the type of operation of the circuit changes. This circuit cannot be considered a sequential network, but rather is a combinatorial circuit whose outputs, at a given moment, is solely dependent upon the input values at the same moment.

However, it can easily be seen that the output Q is placed in the preferential state 1, independently of the particular configuration of the inputs.

Let us now examine the various possible cases of configuration of the inputs:

For either S=0 and R=0 or for S=1 and R=0, when transistor $T_5$ has just been cut off, transistor $T_6$ is forced to conduct at saturation due to the emitter currents of transistors $T_1$ and $T_2$ which flows to the base of transistor $T_6$, since the emitter currents are no longer absorbed by transistor $T_5$. The saturation of transistor $T_6$ (and of transistor $T_3$ for S=1) causes the cut-off of transistor $T_1$, so the output Q can be placed in the 1 state for the potential conditions imposed by the divider $R_1$ and $R_{12}$.

For S=0 and R=1, transistor $T_4$ is at saturation and transistors $T_2$ and $T_3$ are cut off. The current flowing through $R_2$ and $R_{21}$ tends to maintain transistor $T_1$ in conduction. The emitter current of transistor $T_1$, which is not being absorbed by transistor $T_5$, is sufficient to cause transistor $T_6$ to become saturated. Since transistor $T_6$ is at saturation, the base of transistor $T_1$ is at a potential level such as to maintain transistor $T_1$ in conduction at the cut-off threshold, so that the collector current of transistor $T_1$ is very low and, hence, the potential conditions imposed by the divider $R_1$ and $R_{12}$ still place the output Q in the 1 state.

For S=1 and R=1, transistors $T_3$ and $T_4$ are saturated, so that transistors $T_1$, $T_2$ and $T_6$ are cut off. Even in this case, the output Q is placed in the 1 state for the potential conditions imposed by the divider $R_1$ and $R_{12}$.

While the output Q is thus placed in a given preferential state whenever transistor $T_5$ is driven into cut-off, the state of the output $\overline{Q}$ is dependent upon the configuration of the inputs S and R and can be either 0 or 1.

It can be noted that if the collector of transistor $T_6$ were instead connected to the base transistor of $T_2$ instead of transistor $T_1$, the structure of the resulting circuit would then be identical to that of FIG. 1. Thus, by maintaining the same designations for the inputs and outputs, what has been stated for the circuit of FIG. 1, after exchanging Q for $\overline{Q}$, would still hold good. Therefore, in this case, the cut-off of transistor $T_5$ would determine the placing in a prescribed state, more particularly in the 1 state, of the output $\overline{Q}$, while Q would be in the 0 or 1 state, depending upon the state of the inputs S and R.

In the circuit shown in FIG. 2, the control terminal C enables the alternate conduction into saturation of transistors $T_6$ or $T_7$ whenever transistor $T_5$ is cut off, and in both cases, the part of the circuit which is operating is still perfectly equivalent to the circuit depicted in FIG. 1 since the collector of transistor $T_6$ in FIG. 2 is connected to the base of transistor $T_1$, while the collector of transistor $T_7$ is connected to the base of $T_2$. It is obvious, on the basis of what has been said earlier, that if transistor $T_6$ is conducting, the output Q is placed in the preferential state 1. If, instead, transistor $T_7$ is conducting, the output $\overline{Q}$ is placed in the preferential state 1.

In conclusion, the circuit of FIG. 2 operates as a normal bistable S-R multivibrator whenever transistor $T_5$ is conducting, whereas, whenever transistor $T_5$ is cut off, it, the circuit as a combinatorial network with two outputs, Q and $\overline{Q}$, one of which (this can be determined with the control C) is placed in the preferential stage 1, independently of the configuration of the inputs.

A bistable multivibrator circuit embodying the present invention is particularly adapted for integration as a monolithic semiconductor circuit by use of the well-known integration technology and since this circuit involves only a limited number of resistors and transistors which are all of the same type, this production technique is economical from the industrial point of view.

Since only two embodiments of the invention have been shown and described above, it will be evident that various changes and modifications may be made therein without departing from the scope of the invention.

By way of example, the circuits illustrated in FIGS. 1 and 2 can also be made, with appropriate circuit modifications, by those skilled in the art, using field-effect transistors, particularly of the MOS type.

We claim:

1. A monolithically integratable bistable multivibrator circuit having a pair of inputs and a pair of outputs, said circuit comprising a first transistor, a second transistor, a third transistor, and a fourth transistor, each of said transistors having a first terminal and a second terminal and a control terminal, and each of said transistors being of the same conductivety type, wherein:

said second terminal of said first transistor is connected through a resistance means to a first pole of a DC supply voltage generator and to said control terminal of said second transistor;

said second terminal of said second transistor is connected through another resistance means to said first pole of said DC supply voltage generator and to said control terminal of said first transistor;

said second terminal of said first transistor comprises a first output of said pair of circuit outputs;

said second terminals of said third transistor and said fourth transistor are respectively connected to said control terminals of said first transistor and said second transistor;

said first terminals of said third and said fourth transistor are connected to a second pole of said DC supply voltage generator;

said control terminals of said third and fourth transistors comprise said pair of input terminals of said circuit;

said circuit further comprising a fifth transistor and a sixth transistor, each of said transistors having a first terminal and a second terminal and a control terminal, and being of the same conductivity type as that of said first through fourth transistors, wherein:

said first terminal of said fifth and sixth transistors are connected to said second pole of said DC supply voltage generator;

said second terminal of said fifth transistor is connected to said control terminal of said sixth transistor and to said first terminals of said first and second transistors;

said second terminal of said sixth transistor is connected to said control terminal of said first transistor;

and said control terminal of said fifth transistor comprises a control terminal for placing said first output in a preferential prescribed state in response to an input applied thereto irrespective of input signals applied to said pair of inputs.

2. A monolithically integratable bistable multivibrator circuit having a pair of inputs and a pair of outputs, said circuit comprising a first transistor, a second transistor, a third transistor and a fourth transistor, each of said transistors having a first terminal and a second terminal and a control terminal, and each of said transistors being of the same conductivity type; wherein:

said second terminal of said first transistor is connected through a resistance means to a first pole of a DC supply voltage generator and to said control terminal of said second transistor;

said second terminal of said second transistor is connected through another resistance means to said first pole of said DC supply voltage generator and to said control terminal of said first transistor;

said second terminal of said first transistor and said second terminal of said second transistor respectively comprise first and second outputs of said pair of circuit outputs;

said second terminals of said third transistors and said fourth transistor are respectively connected to said control terminal of said first transistor and said control terminal of said second transistor;

said first terminal of said third and fourth transistors are connected to a second pole of said DC supply voltage generator;

said control terminals of said third and fourth transistors comprising said pair of input terminals of said circuit;

said circuit further comprising a fifth transistor, a sixth transistor, and a seventh transistor, each of said transistors having a first terminal and a second terminal and a control terminal, and being of the same conductivity type as that of said first through fourth transistors, wherein:

said first terminal of said fifth transistor is connected to said second pole of said DC supply voltage generator;

said first terminals of said sixth and seventh transistors are connected to said second pole of said DC supply voltage generator through a switching circuit means which is provided with a control terminal through which said switching circuit is alternately enabled so as to alternately connect said first terminals of either said sixth or seventh transistors to said second pole of said DC supply voltage generator;

said second terminal of said fifth transistor is connected to said first terminals of said first and second transistors and to said control terminals of said sixth and seventh transistors;

said second terminals of said sixth and seventh transistors are respectively connected to said control terminal of said first transistor and to said control terminal of said second transistor;

said control terminal of said fifth transistor comprises a control terminal for placing either said first or second circuit outputs in a preferential state in response to an input applied thereto in dependence upon whether said first terminal or said sixth or seventh transistors is connected to said second pole of said DC supply voltage generator by said switching means and irrespective of signals applied to said pair of inputs.

3. A bistable multivibrator circuit according to claim 1, wherein all of said transistors comprise bipolar transistors, and wherein said first terminal, control terminal, and second terminal of each transistor respectively corresponds to an emitter terminal, base terminal, and collector terminal thereof.

4. A bistable multivibrator circuit according to claim 2, wherein all of said transistors comprise bipolar transistors, and wherein said first terminal, control terminal, and second terminal of each transistor respectively corresponds to an emitter terminal, base terminal, and collector terminal thereof.

* * * * *